United States Patent [19]
Choi

[11] Patent Number: 5,459,100
[45] Date of Patent: Oct. 17, 1995

[54] METHOD FOR FORMING METAL WIRING OF SEMICONDUCTOR DEVICE

[75] Inventor: Kyeong K. Choi, Kyoungki-do, Rep. of Korea

[73] Assignee: Hyundai Electronics Industries Co., Ltd., Kyoungki-do, Rep. of Korea

[21] Appl. No.: 363,634

[22] Filed: Dec. 21, 1994

[30] Foreign Application Priority Data

Dec. 21, 1993 [KR] Rep. of Korea ............... 93-28892

[51] Int. Cl.⁶ ................ H01L 21/265; H01L 21/283
[52] U.S. Cl. ................ 437/195; 437/24; 437/187; 437/189; 437/192
[58] Field of Search ............... 437/24, 187, 189, 437/192, 195; 257/760

[56] References Cited

U.S. PATENT DOCUMENTS

| | | | |
|---|---|---|---|
| 4,746,621 | 5/1988 | Thomas et al. | 437/24 |
| 4,954,214 | 9/1990 | Ho | 156/628 |
| 5,183,795 | 2/1993 | Ting et al. | 437/230 |
| 5,204,286 | 4/1993 | Doan | 437/195 |
| 5,231,051 | 7/1993 | Baldi et al. | 437/187 |
| 5,275,963 | 1/1994 | Cederbaum et al. | 437/48 |
| 5,282,160 | 1/1994 | Yamagata | 365/185 |

FOREIGN PATENT DOCUMENTS 2-203531  8/1990  Japan .
3-34315   2/1991  Japan .

OTHER PUBLICATIONS

Hennessy, W. A., et al., "Selective CVD Tungsten on Silicon Implanted $SiO_2$", J. Electrochem. Soc., vol. 135, No. 7, Jul. 1988, pp. 1730–1734.

Primary Examiner—T. N. Quach
Attorney, Agent, or Firm—Morgan & Finnegan

[57] ABSTRACT

A method for forming a metal wiring of a semiconductor device, capable of avoiding a complexity of procedural steps involved in the formation of a metal plug buried in deeper contact holes having different depths in the formation of the metal wiring buried in the contact holes. The method includes the steps of: forming a first insulating film over a wafer; forming contact holes having different depths; depositing a pattern oxide film comprised of a spin-on-glass film over the entire exposed surface of the resulting structure obtained after the formation of the contact holes; forming a photoresist film pattern; etching a selected portion of the pattern oxide film, thereby exposing the contact holes and a portion of the first insulating film disposed in a region where a metal wiring is to be formed; implanting silicon ions in the exposed portion of the first insulating film and lower portions of the exposed contact holes so as to form a seed layer; removing the photoresist film pattern; and depositing a selective metal film over the first insulating film and the lower portions of the exposed contact holes, whereby the selective metal film being grown forms the metal wiring while being buried in the contact holes.

4 Claims, 4 Drawing Sheets

METHOD FOR FORMING METAL WIRING OF SEMICONDUCTOR DEVICE

BACKGROUND OF THE INVENTION

1. Field of the Invention

The present invention relates to a method for forming a metal wiring of a semiconductor device, and more particularly to a method for forming a metal wiring of a semiconductor device capable of forming a metal plug buried in deeper contact holes having different depths simultaneously with the formation of the metal wiring.

2. Description of the Prior Art

As a semiconductor device has an increased integration degree, its contact hole has a decreased diameter and an increased depth. The contact hole serves to bring an upper conduction layer into contact with a lower conduction layer. Where the upper conduction layer is made of aluminum, there is a limitation on depositing the upper conduction layer on the contact hole having a critical dimension by use of an aluminum sputtering process. In other words, a void is formed in the aluminum layer because the deposition of aluminum on the contact hole is carried out at a low rate in a region near the lower portion of the contact hole and at a high rate in a region near the upper portion of the contact hole. Such a void results in an increase in contact resistance. Moreover, a problem exists in that the aluminum layer may be easily eroded at its portion near the void by the lapse of time.

In order to solve the above-mentioned problems, there has been proposed the formation of a metal plug in the contact hole. This conventional technique will be described in detail, in conjunction with FIGS. 1 to 3.

In accordance with this method, a field oxide film 2 is formed on a semiconductor substrate 1, as shown in FIG. 1. A transistor (not shown) is also formed at an active region of the semiconductor substrate 1. Over the entire exposed surface of the resulting structure, a first insulating film 3 is then formed. Thereafter, a lower conduction wiring 4 is formed on a portion of the first insulating film 3 disposed over the field oxide film 2. Over the entire exposed surface of the resulting structure, a second insulating film 5 and a third insulating film 6 are formed in a sequential manner. Formation of contact holes 10 and 11 is then carried out in order to bring an upper metal wiring to be subsequently formed into contact with the silicon substrate 1 and the lower conduction wiring 4. It can be found that the depth of contact hole may be varied depending on the contact position of the upper conduction wiring.

Where a semiconductor device has deep contact holes having different depths such as the contact holes 10 and 11 of FIG. 1, a void may be formed in a metal layer buried in deeper contact holes such as the contact hole 10 of FIG. 1. In accordance with the illustrated method, formation of a metal plug 22 in the deeper contact hole 10 is carried out in order to prevent the generation of the void, as shown in FIG. 2. The formation of the metal plug 22 is achieved by growing a selective metal film, for example, a tungsten film to a predetermined thickness in the deeper contact hole 10 by use of a chemical vapor deposition (CVD) process. In order to prevent the tungsten film from being grown in the contact hole 11, a photoresist film 20 is coated on the contact hole 11 prior to the formation of the metal plug 22.

Thereafter, the photoresist film 20 is removed, as shown in FIG. 3. Under this condition, an aluminum layer is deposited to a predetermined thickness over the entire exposed surface of the resulting structure, thereby forming a metal layer 23 for forming the upper conduction wiring. The metal layer 23 is buried in the contact holes and coated on the third insulating film 6.

As the metal layer 23 is formed under the condition that the metal plug 22 has been formed, no void is formed in portions of the metal layer buried in the contact holes.

Subsequently, the metal layer 23 is subjected to a photoresist film patterning process and an etching process so that it is patterned.

Although the above-mentioned conventional method prevents the formation of a void, it has a problem of additional procedural steps because the photoresist film should be coated on the contact hole having a smaller depth prior to the formation of the metal plug and subsequently be removed. Furthermore, the method requires the use of a masking process upon forming the metal wiring after the deposition of the metal layer. In addition, where a subsequent treatment after the formation of the metal plug is delayed, an oxide film may be formed on the surface of the metal plug. This oxide film results in an increase in electrical resistance of the metal film subsequently formed.

SUMMARY OF THE INVENTION

Therefore, an object of the present invention is to provide a method for forming a metal wiring of a semiconductor device, capable of simplifying the formation and the above-mentioned problems associated with the contact hole.

In accordance with the present invention, this object can be accomplished by providing a method for forming a metal wiring of a semiconductor device, comprising the steps of: forming a lower conduction wiring on a silicon substrate such that the lower conduction wiring is insulated from the silicon substrate, and then forming a first insulating film for a planarization over the lower conduction wiring; etching predetermined portions of the first insulating film, thereby forming contact holes respectively adapted to expose the substrate and the lower conduction wiring and having different depths; depositing a second insulating film over the entire exposed surface of the resulting structure obtained after the formation of the contact holes such that the second insulating film is sufficiently buried in the contact holes; forming a photoresist film pattern for a metal wiring mask on the insulating film; etching an exposed portion of the second insulating film not covered with the photoresist film pattern, thereby exposing the contact holes and a portion of the first insulating film disposed in a region where the metal wiring is to be formed; implanting silicon ions in the exposed portion of the first insulating film and lower portions of the exposed contact holes so as to grow a selective metal film over the first insulating film; removing the photoresist film pattern; and growing the selective metal film over the first insulating film and the lower portions of the exposed contact holes, whereby the selective metal film being grown forms the metal wiring while being buried in the contact holes.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
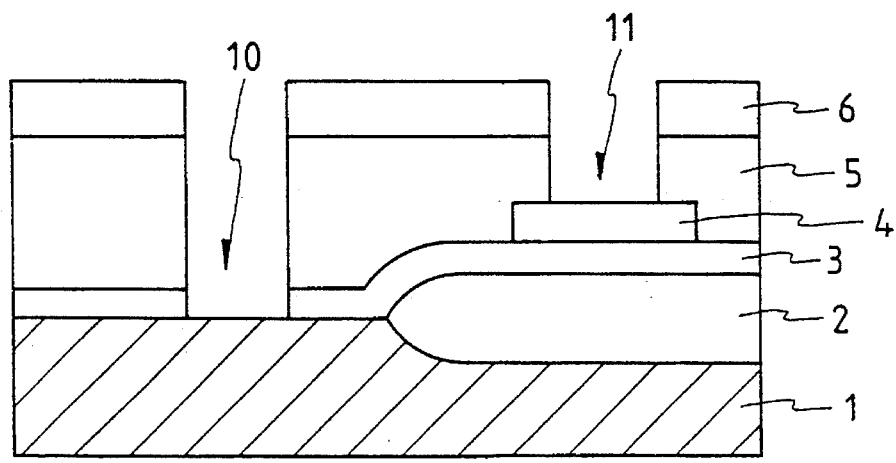
FIGS. 1 to 3 are sectional views respectively illustrating a conventional method for forming a metal wiring being in contact with a lower conduction film through contact holes having different depths in a semiconductor device.
Figure 2:
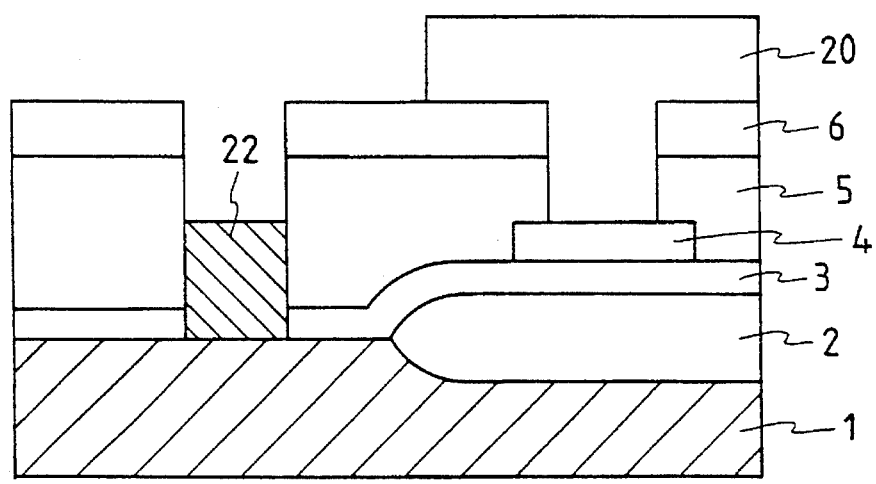
Figure 3:
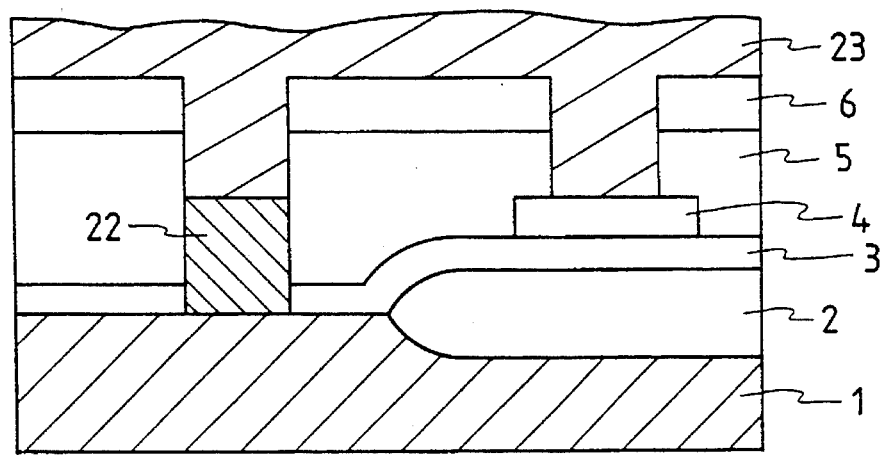

FIGS. 4 to 8 are sectional views respectively illustrating a method for forming a metal wiring buried in contact holes having different depths in a semiconductor device in accordance with the present invention. In FIGS. 4 to 8, elements respectively corresponding to those in FIGS. 1 to 3 are denoted by the same reference numerals.

Figure 4:
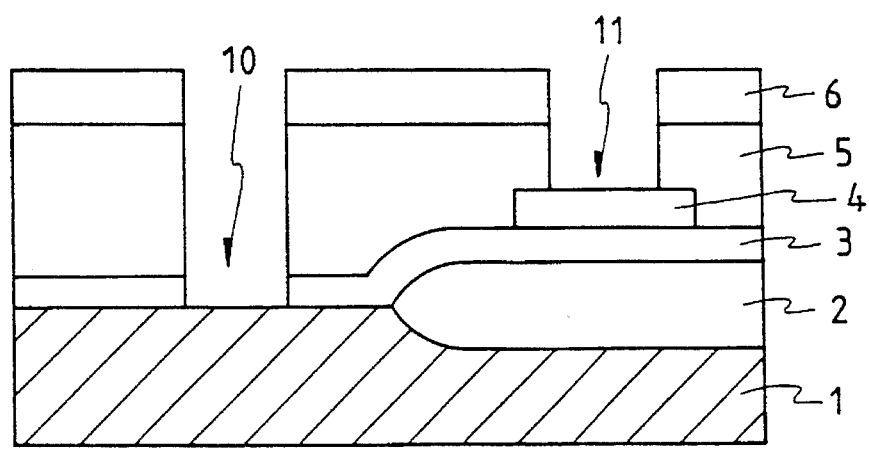
FIGS. 4 to 8 are sectional views respectively illustrating a method for forming a metal wiring being in contact with a lower conduction film through contact holes having different depths in a semiconductor device in accordance with the present invention.

In accordance with the present method, a field oxide film 2 is formed on a semiconductor substrate 1, as shown in FIG. 4. A transistor (not shown) is also formed at an active region of the semiconductor substrate 1. Over the entire exposed surface of the resulting structure, a first insulating film 3 is then formed. Thereafter, a lower conduction wiring 4 is formed on a portion of the first insulating film 3 disposed over the field oxide film 2 over the entire exposed surface of the resulting structure, a second insulating film 5 for a planarization, for example, a spin-on-glass (SOG) film, is formed. A third insulating film 6 is then formed over the second insulating film 5. Formation of contact holes 10 and 11 is then carried out in order to bring an upper metal wiring to be subsequently formed into contact with the silicon substrate 1 and the lower conduction wiring 4. As mentioned above, it can be found that the depth of a contact hole may be varied depending on the contact position of the upper conduction wiring.

Figure 5:
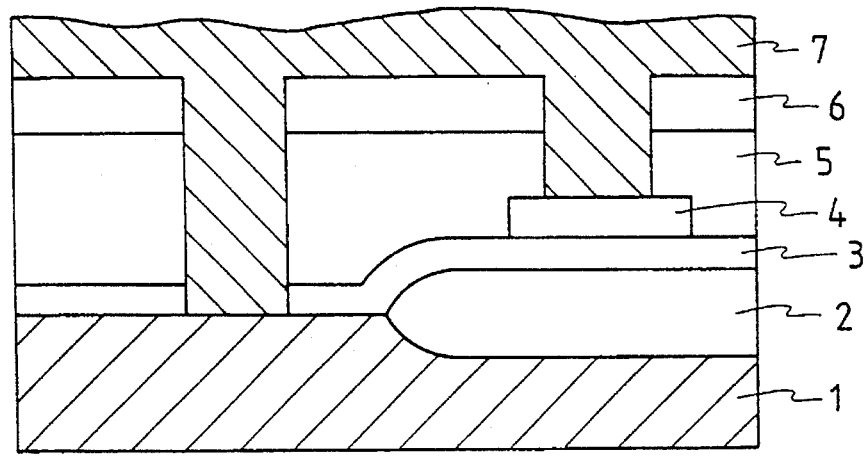

Over the entire exposed surface of the resulting structure, a fourth insulating film 7 is then formed, as shown in FIG. 5. The fourth insulating film 7 is comprised of an SOG film and has a thickness of about 4,000 Å in order to easily control the thickness of the metal wiring and easily achieve subsequent planarization.

Figure 6:
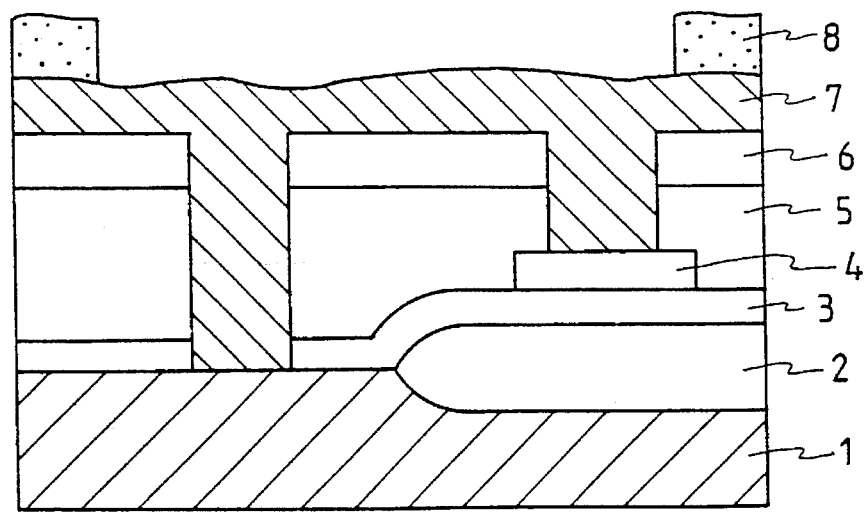

Subsequently, a photoresist film is coated over the fourth insulating film 7. The photoresist film is then patterned so as to remove its portion disposed at a region where the metal wiring is to be formed. As a result, a photoresist film pattern 8 is formed, as shown in FIG. 6.

Figure 7:
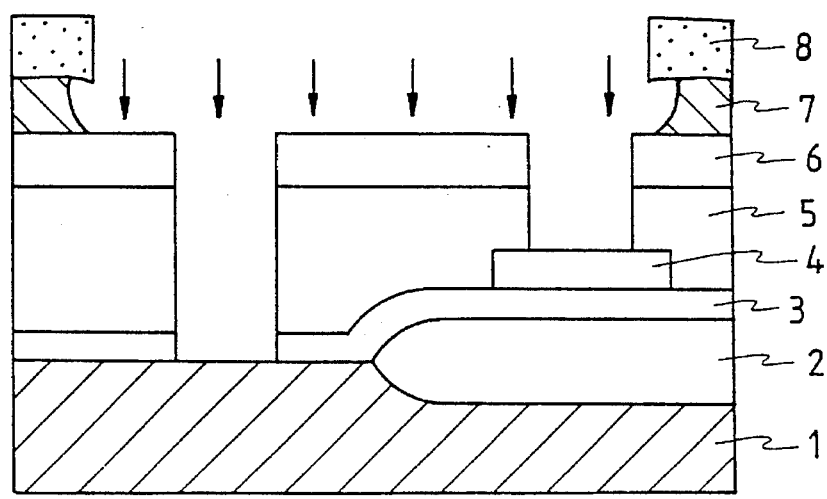
Figure 8:
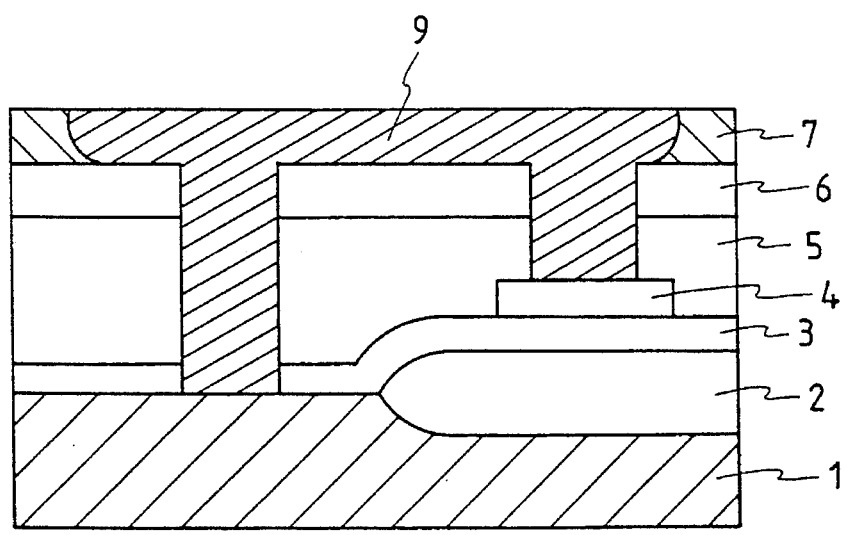

Using the photoresist film pattern 8 as a mask, the fourth insulating film 7 is removed by a wet etching process so as to expose surface portions of the contact holes 10 and 11 and the third insulating film 6 disposed in a region where the metal wiring is to be formed, as shown in FIG. 7. Under this condition, silicon ions are implanted in the exposed portion of the resulting structure including a portion of silicon substrate 1 exposed through the contact hole 10, a portion of lower conduction wiring 4 exposed through the contact hole 11 and the exposed portion of third insulating film 6. Upon carrying out the wet etching process to remove the fourth insulating film 7, a buffer oxide etchant (BOE) solution is used. On the other hand, the implantation of silicon ions is carried out using a silicon dose amount of about $1.0\times10^{14}$ to about $1.0\times10^{15}$ and an energy of about 20 KeV to about 50 KeV.

Thereafter, the deposition of a selective metal film 9 is carried out to form a metal plug. At this time, the metal wiring is formed simultaneously with the formation of the metal plug. The deposition of the selective metal film is carried out in a low pressure chemical deposition reactor. The selective metal film is made of tungsten, aluminum or copper.

Since the metal plug and the metal wiring are formed in a simultaneous manner in accordance with the present invention, it is possible to simplify the formation of the metal wiring. In accordance with the present invention, it is unnecessary to form a barrier metal film on the bottom surface of the contact hole. Since the formation of the metal wiring requires no subsequent etching, it is possible to achieve procedural and economic improvements in the formation of the metal wiring of a semiconductor device and to easily achieve planarization.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal wiring of a semiconductor device, comprising the steps of:

forming a lower conduction wiring on a silicon substrate such that the lower conduction wiring is insulated from the silicon substrate, and then forming a first insulating film for a planarization over the lower conduction wiring;

etching predetermined portions of the first insulating film, thereby forming contact holes having different depths and respectively adapted to expose the substrate and the lower conduction wiring;

depositing a second insulating film over the entire exposed surface of the resulting structure obtained after the formation of the contact holes such that the second insulating film is sufficiently buried in the contact holes;

forming a photoresist film pattern for a metal wiring mask on the insulating film;

etching an exposed portion of the second insulating film not covered with the photoresist film pattern, thereby exposing the contact holes and a portion of the first insulating film disposed in a region where the metal wiring is to be formed;

implanting silicon ions in the exposed portion of the first insulating film and lower portions of the exposed contact holes so as to grow a selective metal film over the first insulating film;

removing the photoresist film pattern; and growing the selective metal film over the first insulating film and the lower portions of the exposed contact holes, whereby the selective metal film being grown forms the metal wiring while being buried in the contact holes.

2. A method in accordance with claim 1, wherein the second insulating film is comprised of a spin-on-glass film.

3. A method in accordance with claim 1, wherein the step of growing the selective metal film is carried out using a low pressure chemical vapor deposition process.

4. A method in accordance with claim 1, wherein the step of etching the exposed portion of the second insulating film is carried out using a wet etching process.

* * * * *